(12) United States Patent
Zimmermann

(10) Patent No.: US 7,542,327 B2
(45) Date of Patent: Jun. 2, 2009

(54) MEASURING METHOD FOR A SEMICONDUCTOR MEMORY, AND SEMICONDUCTOR MEMORY

(75) Inventor: Ulrich Zimmermann, Ottendorf-Okrilla (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/638,766

(22) Filed: Dec. 14, 2006

(65) Prior Publication Data

US 2007/0153598 A1 Jul. 5, 2007

(30) Foreign Application Priority Data

Dec. 15, 2005 (DE) .................... 10 2005 060 086

(51) Int. Cl.
*G11C 11/24* (2006.01)

(52) U.S. Cl. .................. 365/149; 365/192; 365/194

(58) Field of Classification Search ................. 365/149, 365/192, 194
See application file for complete search history.

(56) References Cited

U.S. PATENT DOCUMENTS

| 6,600,680 | B2 * | 7/2003 | Sell et al. ............... 365/189.09 |
| 6,774,734 | B2 | 8/2004 | Christensen et al. |
| 7,066,643 | B2 * | 6/2006 | Lee et al. .................... 374/170 |
| 2006/0126412 | A1 * | 6/2006 | Maki ......................... 365/201 |
| 2006/0268632 | A1 * | 11/2006 | Schnell et al. .............. 365/194 |
| 2007/0086232 | A1 * | 4/2007 | Joshi et al. .................. 365/154 |
| 2007/0237012 | A1 * | 10/2007 | Kuang et al. ................ 365/201 |

* cited by examiner

*Primary Examiner*—Thong Q Le
(74) *Attorney, Agent, or Firm*—Dicke, Billig & Czaja, PLLC

(57) ABSTRACT

The invention relates to a semiconductor memory, and to a measuring method for a semiconductor memory. In one case, the method includes connecting a memory cell to a ring oscillator and measuring the frequency resulting for said ring oscillator.

16 Claims, 2 Drawing Sheets

MEASURING METHOD FOR A SEMICONDUCTOR MEMORY, AND SEMICONDUCTOR MEMORY

CROSS-REFERENCE TO RELATED APPLICATIONS

This Utility Patent Application claims priority to German Patent Application No. DE 10 2005 060 086.7 filed on Dec. 15, 2005, which is incorporated herein by reference.

BACKGROUND

The invention relates to a semiconductor memory, in particular a DRAM (Dynamic Random Access Memory), and to a measuring method for a semiconductor memory.

In DRAMS, the respective memory cells may e.g. consist substantially of capacitors. The memory cells/capacitors are adapted to be connected to bit lines which serve to transmit a data value to be read out from a memory cell, or a data value to be read into the memory cell.

During the reading out of a memory cell, an access transistor that is connected with the capacitor of a memory cell is connected through by the activation of a word line, and the charge state stored in the capacitor is applied to the bit line.

Subsequently, the weak signal emanating from the capacitor is amplified by a sense amplifier. The sense amplifier comprises complementary signal inputs. The bit lines connected to these signal inputs are referred to as bit line and complementary bit line.

In today's DRAMS, the sense amplifiers may be used as "shared parts" so as to save chip space. In so doing, a sense amplifier is used both during the reading out of a memory cell positioned at the left and a memory cell positioned at the right side along respective bit lines associated with the sense amplifier (hence, the sense amplifiers are used as so-called "shared sense amplifiers").

Prior to the reading out of the memory cells, the corresponding bit line sections, i.e. the corresponding sections of the non-complementary bit line and of the complementary bit line, are, by so-called precharge/equalize circuits that are connected with the bit lines, precharged to the same potential. The precharge potential may correspond to half the voltage of a bit line in a logic high state (i.e. to VBLH/2). This ensures that—prior to the reading out of data—no differences occur between the potential of the section of the bit line and the section of the corresponding complementary bit line, which otherwise might superimpose the small amount of charge transferred by the capacitor of a memory cell to the bit lines during reading out. Directly prior to the reading out of the memory cells the pre-charge/equalize circuits which are connected to the bit line sections that are connected with the memory cell to be read out are switched off.

The DRAMs known in prior art moreover include isolation circuits with isolation transistors, which serve to decouple the sense amplifier during the reading out of the memory cells from the side/the bit line sections that is/are not connected to memory cells to be read out.

Each isolation circuit may, for instance, consist of two NMOS-FETs, the source-drain paths of which are adapted to interrupt the corresponding bit line sections.

With the known DRAMs, outside the read and write cycles, corresponding bias voltages are applied to the gates of the isolation transistors of the isolation circuits. These bias voltages may e.g. correspond to a voltage (VINT) generated internally in the DRAM.

Directly prior to the reading out of a memory cell, the side of the sense amplifier which is connected with the memory cells not to be read out is coupled off the respective bit line section(s) by the gates of the corresponding isolation transistors positioned on this side of the sense amplifier being put to ground. Simultaneously, the other side of the sense amplifier may be coupled electrically to the corresponding bit line section(s) by the gate voltage that is applied to the gates of the isolation transistors positioned on the other side of the sense amplifier being increased e.g. from its above initial value VINT to a voltage value VPP.

The actual reading out of the memory cell is initiated shortly thereafter by appropriate word line signals connecting through the access transistors that are connected with the storage capacitors. Subsequently, appropriate activating voltages are applied to the sense amplifier, whereupon the sense amplifier amplifies the potential differences transmitted from the storage capacitors to the corresponding bit line sections, and outputs a corresponding amplified differential signal.

The correspondingly amplified differential signal is transmitted from the sense amplifier to corresponding local data lines which are adapted to be coupled to the sense amplifier by appropriate transistors.

The above-mentioned amplified differential signal is transmitted from the local data lines to corresponding global data lines, and to a further amplifier (so-called "secondary sense amplifier") for further amplification.

To enable a quick reading out of data from the memory cells, or a quick reading of data into the memory cells, respectively, the capacitors of the memory cells must be capable of being discharged or charged quickly (e.g. in the range of nano seconds).

If the (current) path connected with the capacitor of a memory cell comprises a relatively high (series) resistance value, quick charging/discharging of the capacitor is prevented by the resulting relatively large RC constant.

The above-mentioned series resistance value is substantially caused by the ohmic resistance of the connection between the memory cell capacitor and the respective memory cell access transistor.

For the above mentioned reasons, it is desirable to be able to measure the above-mentioned series resistance value or the above-mentioned RC constant, respectively, as exactly as possible, in particular with corresponding or similar frequencies as in normal operation of the semiconductor memory.

SUMMARY

One embodiment of the invention provides a novel semiconductor memory and a novel measuring method for a semiconductor memory. In one embodiment, provided is a semiconductor memory and a measuring method by which the series resistance value or the RC constant, respectively, or a magnitude representing the resistance value or the RC constant, respectively, resulting for a memory cell can be measured as exactly as possible.

In accordance with one aspect of the invention there is provided a semiconductor memory including a memory cell, a ring oscillator, and a switching device for connecting the memory cell to the ring oscillator.

In accordance with another aspect of the invention there is provided a measuring method for a semiconductor device. The method includes connecting a memory cell to a ring oscillator, and measuring the frequency resulting for the ring oscillator.

In one case, the measuring method additionally includes comparing the frequencies resulting for the ring oscillator with a memory cell being connected to the ring oscillator and with a memory cell being disconnected from the ring oscillator.

This way, the time required for charging/discharging the memory cell may be inferred to, and thus the RC constant of the memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
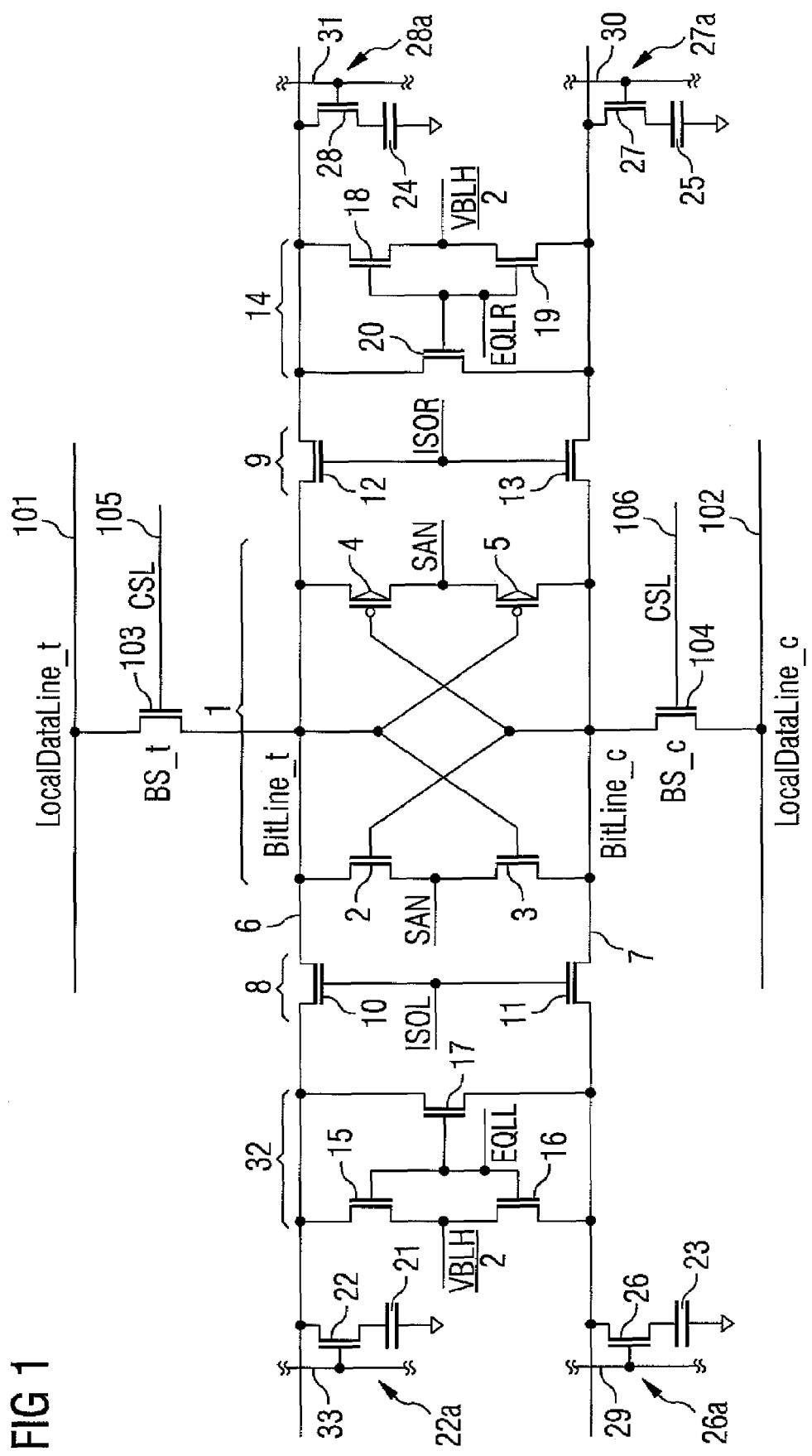
FIG. 1 illustrates a schematic representation of a section of a DRAM for which one embodiment of the measuring method may be used.

FIG. 1 illustrates a schematic representation of a section of a DRAM for which a measuring method in accordance with one embodiment may be used.

The DRAM includes a sense amplifier 1 consisting of two NMOS-FETs 2 and 3 and two PMOS-FETs 4 and 5, connected in the manner of a flip-flop. One end of the source-drain path of the first NMOS-FET 2 is connected with a bit line 6 (BitLine_t). In addition, the gate of the first NMOS-FET 2 is connected with a further bit line 7 (BitLine_c) complementary to the bit line 6.

Furthermore, the other end of the source-drain path of the first NMOS-FET 2 is connected with an end of the source-drain path of the second NMOS-FET 3, the source-drain path of which is connected at its other end with the complementary bit line 7. In addition, the gate of the second NMOS-FET 3 is connected with the bit line 6.

One end of the source-drain path of the first PMOS-FET 4 is connected with the bit line 6. In addition, the gate of the first PMOS-FET 4 is connected with the complementary bit line 7. Furthermore, the other end of the source-drain path of the first PMOS-FET 4 is connected with an end of the source-drain path of the second PMOS-FET 5, the source-drain path of which is connected at its other end with the complementary bit line 7. In addition, the gate of the second PMOS-FET 5 is connected with the bit line 6.

When the sense amplifier 1 is to be activated, corresponding voltages SAN or SAP, respectively, are applied to the connection points of the source-drain paths of the two NMOS-FETs 2 and 3 and the two PMOS-FETs 4 and 5.

The sense amplifier 1 illustrated in FIG. 1 is known in prior art and is, for instance, described in the book "VLSI Memory Chip Design" by Kiyoo Itoh, Publishing House Sprin-ger, Berlin, Heidelberg, N.Y., 2001, on pages 15 to 17. This section of the book and the rest of this book are therefore expressly incorporated in this description by reference.

The sense amplifier 1 is connected with an isolation circuit 8 and 9, respectively, at the left and at the right. The isolation circuits 8 and 9 consist of two NMOS-FETs 10, 11 and 12, 13, respectively, the source-drain paths of which are adapted to interrupt the bit lines 6 and 7 to decouple the corresponding side of the sense amplifier 1 during reading or writing data out from or into the memory cells positioned on the respective other side of the sense amplifier 1.

The gates of the NMOS-FETs 10, 11 and 12, 13, respectively of the isolation circuits 8, 9 which are connected with one another can be triggered by a control voltage ISOL (in the case of the isolation circuit 8 positioned at the left of the sense amplifier 1) or a control voltage ISOR (in the case of the isolation circuit 9 positioned at the right of the sense amplifier 1), respectively.

The DRAM section illustrated in FIG. 1 in addition includes two precharge/equalize circuits 32 and 14 which are illustrated in FIG. 1 at the left and at the right side next to the isolation circuits 8 and 9. The precharge/equalize circuits 32 and 14 serve to charge the corresponding sections of the bit line 6 and of the complementary bit line 7—prior to the reading or writing of data out from or into a memory cell—to the same voltage, e.g. to a voltage that corresponds to half the voltage of a bit line in a logic high state (VBLH/2).

Each precharge/equalize circuit 32, 14 consists of three NMOS-transistors 15, 16, 17 or 18, 19, 20, respectively. The source-drain path of a first one of the three corresponding NMOS-transistors 17 or 20 of a corresponding precharge/equa-lize circuit 32, 14 is connected between the bit line 6 and the complementary bit line 7. The source-drain paths of the two other NMOS-transistors 15, 16 or 18, 19, respectively, are connected in series, with the series connection also being connected between the bit line 6 and the complementary bit line 7. As can be seen from FIG. 1, the above-mentioned voltage VBLH/2 is present at the connection point of the source-drain paths of the two NMOS-transistors 15, 16 or 18, 19, respectively. The gates of the three NMOS-FETs 15, 16, 17 or 18, 19, 20, respectively, of the precharge/equalize circuits 32, 14 are connected with one another and with a control voltage EQLL or EQLR, respectively, which is supplied by a control circuit (not illustrated in FIG. 1) for switching on and off the precharge/equalize circuits 32, 14. The precharge/equalize circuits 32, 14 illustrated in FIG. 1 are also known in prior art and are, for instance, described in the above-mentioned section of the book by Itoh.

As can be seen from FIG. 1, a plurality of memory cells 22a, 26a, 27a, 28a (and further memory cells not shown in FIG. 1) are connected to each of the bit lines 6 and 7. The memory cells 22a, 26a, 27a, 28a each include a storage capacitor 21, 23, 24, 25 adapted to be connected with the bit lines 6 or 7 via the source-drain path of a corresponding access transistor 22, 26, 27, 28 consisting of an NMOS-FET.

The memory cells 22a, 26a, 27a, 28a—and a plurality of further memory cells that are not shown here—are arranged in a plurality of rows and columns side by side in one or a plurality of cell field regions or arrays, respectively, of the DRAM.

The access transistors 22, 26, 27, 28 are adapted to be triggered via corresponding word lines 29, 30, 31, 33.

As can be further seen from FIG. 1, a first local data line 101 ("LocalDataLine_t") is adapted to be connected—via the source-drain path of a corresponding transistor 103 ("bit switch") (here: an NMOS-FET BS_t)—to the bit line 6, and a second local data line 102 ("LocalDataLine_c") is adapted to be connected—via the source-drain path of a corresponding transistor 104 ("bit switch") (here: an NMOS-FET BS_c)—to the complementary bit line 7.

The transistors 103, 104 may be switched on and off (such that the bit lines 6, 7 are connected with/disconnected from the local data lines 101, 102) by applying a corresponding control signal CSL to the gates of the transistors 103, 104 (e.g. via corresponding pairs of CSL control lines 105, 106).

To read out data from a corresponding memory cell (e.g. the memory cell 22a ("read access"), the corresponding access transistor 22 is connected through by activating the corresponding word line 33 (which results in a connecting through of all of the plurality of access transistors 22, etc. which are connected with the corresponding word line 33 and are arranged in one and the same row or column, respectively, of a corresponding cell field region or array, respectively).

Thus, the charge state stored in the capacitor 21 of the corresponding memory cell 22a is applied to the corresponding bit line 6, 7.

Subsequently, the weak signal emanating from the capacitor 21 is amplified by the above-mentioned sense amplifier 1.

As may be seen from FIG. 1, the sense amplifier 1 is a so-called "shared sense amplifier" that is used both during the reading out of a memory cell (e.g. the memory cell 22a) positioned at the left side, and of a memory cell (e.g. the memory cell 28a) positioned at the right side along the above-mentioned bit lines 6, 7.

Prior to the reading out of a memory cell, corresponding bit line sections, i.e. corresponding sections of the non-complementary bit line 6 and of the complementary bit line 7, are precharged, by a corresponding one of the above-mentioned precharge/equalize circuits 32, 14, to the same potential that corresponds, for instance, to half the voltage of a bit line in the logic high state (VBLH/2).

Directly prior to the reading out of a memory cell, the corresponding precharge/equalize circuit 32, 14 is switched off.

By means of the above-mentioned isolation circuits 8, 9, the sense amplifier 1 is, during the reading out of a memory cell (e.g. the memory cell 22a) disconnected from the side/the bit line section that is not connected with the memory cells to be read out, and coupled to the side/the bit line section that is connected with the memory cells (e.g. the memory cell 22a) to be read out.

The actual reading out of the memory cell (e.g. the memory cell 22a) is initiated shortly thereafter—as mentioned above—by connecting through the corresponding access transistor (e.g. the transistor 22) that is connected with the corresponding capacitor (e.g. the capacitor 21) in that the corresponding word line (e.g. the word line 33) is activated.

Subsequently, appropriate activating voltages are applied to the sense amplifier 1, whereupon the sense amplifier 1 amplifies the potential differences that are transmitted by the corresponding capacitor 21, and outputs a correspondingly amplified differential signal.

The correspondingly amplified differential signal is transmitted by the sense amplifier 1 to the above-mentioned pair of local data lines 101, 102.

To connect the above-mentioned pair of local data lines 101, 102 with the sense amplifier 1, the above-mentioned control signal CSL that is present at the CSL control lines 105, 106 is placed from a logic low to a logic high state, so that the corresponding transistors 103, 104 ("bit switches") are connected through.

The above-mentioned amplified differential signal is then transmitted by the above-mentioned pair of local data lines 101, 102 to corresponding global data lines (in particular to an associated pair of global data lines), and from there to a further amplifier (so-called "secondary sense amplifier") for further amplification.

Subsequently, the above-mentioned control signal CSL that is present at the CSL control lines 105, 106 is again placed from the above-mentioned logic high to the above-mentioned logic low state, so that the corresponding transistors 103, 104 ("bit switches") again disconnect the above-mentioned pair of local data lines 101, 102 from the sense amplifier 1.

To write data into a memory cell (e.g. the memory cell 22a) ("write access"), substantially a process that is inverse to the process described above is performed (which is known in prior art and will therefore not be described in detail here).

In short, a corresponding differential signal is transmitted by the corresponding global data line to the corresponding pair of local data lines 101, 102.

Then, the above-mentioned control signal CSL that is present at the CSL control lines 105, 106 is placed from the above-mentioned logic low state in a logic high state, so that the corresponding transistors 103, 104 ("bit switches") are connected through.

By that, the pair of local data lines 101, 102 is connected with the above-mentioned sense amplifier 1, and the above-mentioned differential signal that is present at the pair of local data lines 101, 102 is transmitted to the sense amplifier 1 (and then to the corresponding memory cell 22a that was selected by activating a corresponding one of the above-mentioned word lines 33).

To enable a quick reading or writing of data, the capacitors 21, 23, 24, 25 of the memory cells 22a, 26a, 27a, 28a must be capable of being discharged or charged quickly (e.g. in the range of nano seconds).

If the (current) path connected with the capacitor 21, 23, 24, 25 of a memory cell 22a, 26a, 27a, 28a comprises a relatively high (series) resistance value, quick charging/discharging of the capacitor is prevented by the resulting relatively large RC constant.

The above-mentioned series resistance value is substantially caused by the ohmic resistance of the connection between the memory cell capacitor 21, 23, 24, 25 and the respective memory cell access transistor 22, 26, 27, 28.

Figure 2:
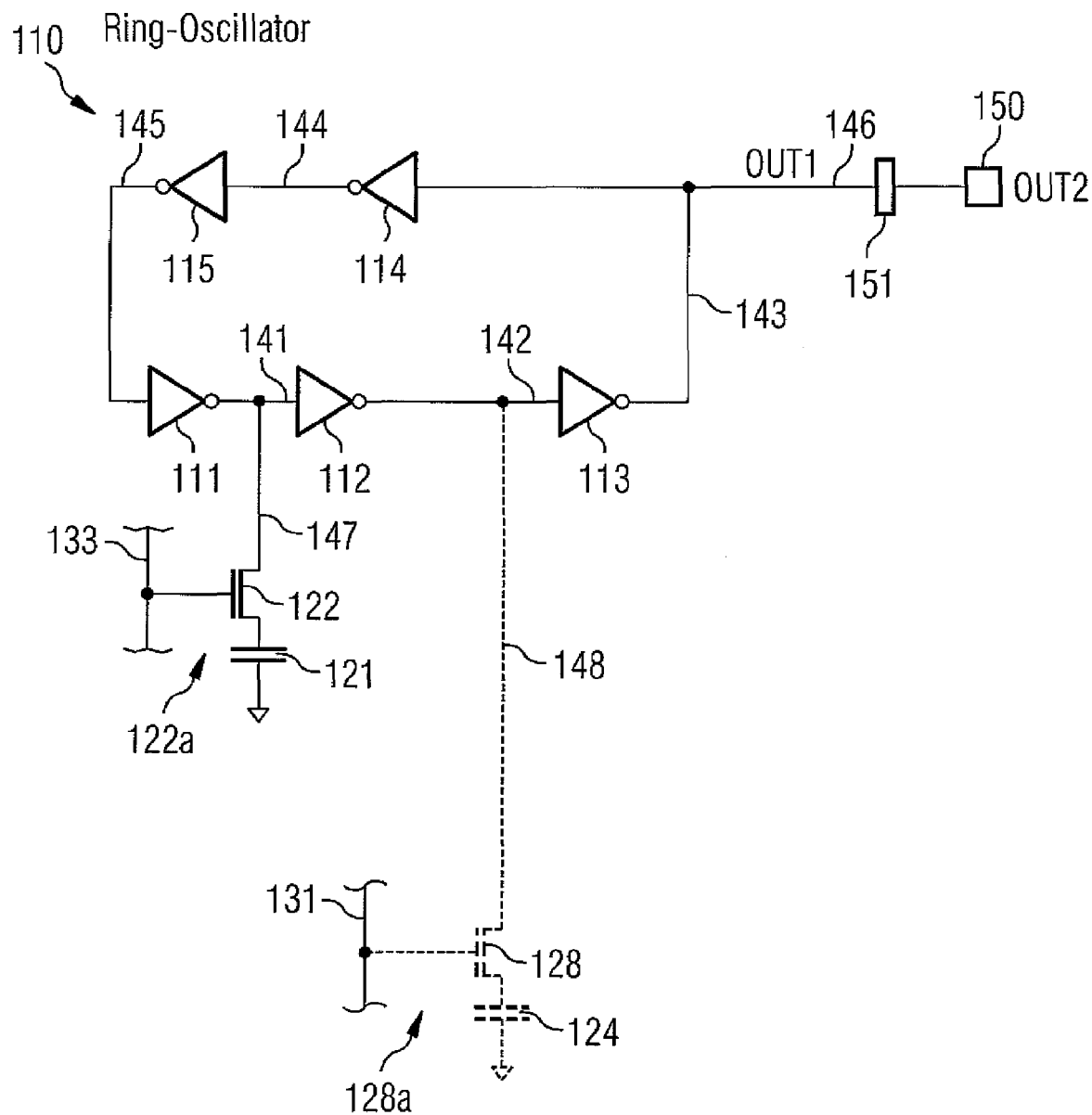
FIG. 2 illustrates a schematic exemplary representation of a ring oscillator adapted to be connected to one or a plurality of memory cells for performing one embodiment of the measuring method.

To be able to measure the above-mentioned series resistance value or the above-mentioned RC constant, respectively, or a magnitude representing the resistance value or the RC constant, respectively, a ring oscillator 110 arranged on the DRAM and illustrated in FIG. 2 is used in one embodiment.

This ring oscillator includes an odd number of inverters 111, 112, 113, 114, 115 that are connected in series and are connected with each other in the form of a ring.

As results from FIG. 2, in the ring oscillator 110, the output of a first inverter 111 is connected, via a line 141, with the input of a downstream second inverter 112, the output of which is, via a line 142, connected with the input of a downstream third inverter 113. The output of the third inverter 113 is, via a line 143, connected with the input of a downstream fourth inverter 114, the output of which is, via a line 144, connected with the input of a downstream fifth inverter 115. The output of the fifth inverter 115 is, via a line 145, connected with the input of the first inverter 111, this resulting in the above-mentioned ring-shaped structure.

Once the ring oscillator 110 is triggered (e.g. by initiating a change of state with one of the inverters 111, 112, 113, 114, 115, or with a signal present at one of the lines 141, 142, 143, 144, 145, respectively), the corresponding signal, or the corresponding change of state, respectively, is—in a respectively inverted manner, and respectively delayed by the gate duration of the respective inverter 111, 112, 113, 114, 115—transmitted further to the respective downstream inverter 111, 112, 113, 114, 115.

The signal or the changes of state, respectively, then continue to run through the ring, wherein the inverters 111, 112, 113, 114, 115 and the signal present at the lines 141, 142, 143, 144, 145 then continue to change their states to and fro.

The frequency of the change of state depends—in a "normal test mode" of the ring oscillator 110 (cf. below)—substantially on the number of inverters 111, 112, 113, 114, 115 provided in the ring, and on the above-mentioned gate duration, and may, for instance, range between some MHz and several GHz, e.g. between 100 MHz and 50 GHz.

As ring oscillator 110, a ring oscillator 110 provided on the DRAM for measuring the switching rate or the gate duration, respectively, of standard devices may be used.

As results from FIG. 2, a signal OUT1 present at one of the lines 141, 142, 143, 144, 145 and output by one of the inverters 111, 112, 113, 114, 115 is, via a line 146, transmitted to a frequency divider 151, and from there—with a divided-down, lower frequency—to an output pad 150 of the DRAM (signal OUT2).

The signal OUT2 is tapped by a test device (not shown) which determines the frequency of the signal OUT2.

From the signal frequency of the signal OUT2—as results from the statements above—(since the number of inverters 111, 112, 113, 114, 115 in the ring oscillator 110 and the frequency division caused by the frequency divider 151 are known), the switching rate or the gate duration, respectively, of the inverters 111, 112, 113, 114, 115 may be inferred to (an thus the switching rate of corresponding, further standard devices used in the DRAM).

In accordance with the embodiment of the invention as explained here, the ring oscillator 110 is, except in the above-mentioned "normal test mode"—that serves to determine the switching rate or the gate duration, respectively-additionally operated in a "special test mode" that will be explained in more detail in the following.

Alternatively, a further ring oscillator—that is structured and equipped substantially identical as the ring oscillator 110 in FIG. 2—may be provided in addition to the ring oscillator 110, wherein the ring oscillator 110 is exclusively configured for operation in the above-mentioned "normal test mode", and the further ring oscillator exclusively for operation in the "special test mode" that will be explained in more detail in the following.

The "special test mode" serves to measure the above-mentioned series resistance value or the above-mentioned RC constant, respectively, of the memory cells 22a, 26a, 27a, 28a (or of (test or dummy) memory cells 122a, 128a provided especially and exclusively for test purposes (cf. below)), or a magnitude representing this series resistance value or this RC constant, respectively.

To this end, the ring oscillator 110 may—in the "special test mode"—be connected with one or with several (test or dummy) memory cells 122a, 128a (e.g. with more than two, three, or five (test or dummy) memory cells 122a, 128a, e.g. a number of (test or dummy) memory cells 122a, 128a which may correspond to the number of inverters 111, 112, 113, 114, 115 provided in the ring oscillator 110).

The (test or dummy) memory cells 122a, 128a may be arranged outside the cell field region(s) or array(s), respectively, in which the actual memory cells 22a, 26a, 27a, 28a provided for storing reference data in normal operation of the DRAM are arranged, or—alternatively—also within a corresponding cell field region or array, respectively.

The (test or dummy) memory cells 122a, 128a are not triggered in normal operation of the DRAM nor serve to store reference data, respectively, but serve—exclusively—for test purposes.

The (test or dummy) memory cells 122a, 128a are structured and equipped correspondingly similar or identical as the memory cells 22a, 26a, 27a, 28a provided in normal operation of the DRAM for storing reference data and illustrated, for instance, in FIG. 1.

As results from FIG. 2, the (test or dummy) memory cells 122a, 128a comprise—correspondingly as the reference data memory cells 22a, 26a, 27a, 28a—a respective storage capacitor 121, 124 and a respective access transistor 122, 128.

The storage capacitors 121, 124 of the (test or dummy) memory cells 122a, 128a are structured and equipped correspondingly similar or identical as the storage capacitors 21, 23, 24, 25 of the normal operation memory cells 22a, 26a, 27a, 28a.

Correspondingly, the access transistors 122, 128 of the (test or dummy) memory cells 122a, 128a are structured and equipped correspondingly similar or identical as the access transistors 22, 26, 27, 28 of the normal operation memory cells 22a, 26a, 27a, 28a.

The access transistors 122, 128 of the (test or dummy) memory cells 122a, 128a may, for instance, consist of an NMOS-FET, the source-drain path of which is connected, at its one end, with the respective storage capacitor 121, 124, and, at its other end, via a corresponding line 147, 148, with the ring oscillator 110, in particular with a corresponding line 141 provided between two corresponding inverters 111, 112.

If several (test or dummy) memory cells 122a, 128a are used, one single (test or dummy) memory cell 122a, 128a may be connected with the line 141 provided between two inverters 111, 112, or—alternatively—also several (test or dummy) memory cells 122a, 128a (e.g. two, three, or more than three (test or dummy) memory cells 122a, 128a).

The gates of the access transistors 122, 128 of the (test or dummy) memory cells 122a, 128a are—other than the access transistors of the normal operation memory cells 22, 26, 27, 28—not triggered via corresponding word lines 29, 30, 31, 33, but via specific test control lines 131, 133.

For operating the DRAM in the above-mentioned "special test mode", one or several access transistors 122, 128 of the (test or dummy) memory cells 122a, 128a are connected through by applying a corresponding signal to the corresponding test control line 131, 133, i.e. are placed from a non-conductive in a conductive state.

This way, one or several ones of the storage capacitors 121, 124 of the (test or dummy) memory cells 122a, 128a are connected in an electroconductive manner with the ring oscillator 110.

In an alternative variant of the inventive measuring method which is also conceivable, instead of the above-mentioned (test or dummy) memory cells 122a, 128a, one or several ones of the above-mentioned normal operation memory cells 22a, 26a, 27a, 28a may also be used for performing the method (which are, for this purpose—in the above-mentioned "special test mode"—adapted to be connected in an electro-conductive manner with the ring oscillator 110, e.g. in that the end of the source-drain path of the corresponding access transistor 22, 26, 27, 28 of the corresponding normal operation memory cell 22a, 26a, 27a, 27a which is connected with a corresponding bit line 6, 7 is, via a corresponding switching means, connected in an electroconductive manner with a corresponding line 141 between two inverters 111, 112 of the ring oscillator 110).

In the "special test mode" of the DRAM—in which, as explained, one or several ones of the (test or dummy) storage capacitors 121, 124 (or—alternatively—of the normal operation storage capacitors 12, 23, 24, 25) is/are connected in an electroconductive manner with the ring oscillator 110—, the ring oscillator 110 is triggered correspondingly similar as described above for the "normal test mode" of the ring oscillator 110.

This may, for instance, again be performed by initiating a state of change with one of the inverters 111, 112, 113, 114, 115, or with a signal present at one of the lines 141, 142, 143, 144, 145, respectively, whereupon the corresponding signal or the corresponding change of state, respectively is—in a respectively inverted manner and respectively delayed—transmitted further from the respective inverter 111, 112, 113, 114, 115 to the respective downstream inverter 111, 112, 113, 114, 115.

The signal or the changes of state, respectively, then continue to run through the ring, wherein the inverters 111, 112, 113, 114, 115 and the signals present at the lines 141, 142, 143, 144, 145 then continue to change their states to and fro.

The frequency of the change of state depends—other than in the "normal operation mode" of the ring oscillator 110—not only on the number of inverters 111, 112, 113, 114, 115 provided in the ring and on the inverter gate duration, but also on the (additional) load caused by the connection of the memory cells 122a, 128a or 22a, 26a, 27a, 28a, respectively, at the lines 141 between the inverters 111, 112 (or on the rate with which the storage capacitors 121, 124 or 12, 23, 24, 25, respectively, are—with a change of state of the signal present at the respective line 141 between the inverters 111, 112—capable of being charged in a first direction and—with a change of state of the signal present at the respective line 141—discharged again in a second, opposite direction, i.e. in other words on the RC constant of the respective memory cell 122a, 128a or 22a, 26a, 27a, 28a, respectively).

The signal OUT1 output at the line 116 by the ring oscillator 110 is—corresponding as in the "normal test mode"—transmitted to the frequency divider 151, and from there—with a divided-down, lower frequency—to the output pad 150 of the DRAM (signal OUT2).

The signal OUT2 is tapped by a test device (not shown) that determines the frequency of the signal OUT2.

As results from the above statements, the determined frequency is lower in the "special test mode", i.e. during operation of the ring oscillator 110 with memory cells 122a, 128a or 22a, 26a, 27a, 28a, respectively, being connected, than in the "normal test mode" (i.e. during operation of the ring oscillator 110 without the connection of memory cells 122a, 128a or 22a, 26a, 27a, 28a, respectively).

From the difference between the signal frequencies in the "special test mode" and in the "normal test mode"—as results from the above statements—(since the number of inverters 111, 112, 113, 114, 115 in the ring oscillator 110 and the frequency division caused by the frequency divider 151, as well as the switching rate or the gate duration, respectively, of the inverters 111, 112, 113, 114, 115 are known), the respective time required for charging/dis-charging the memory cells 122a, 128a or 22a, 26a, 27a, 28a, respectively, may be inferred to (and thus the RC constant of the memory cells 122a, 128a or 22a, 26a, 27a, 28a, respectively).

The magnitude of the capacity C of the storage capacitors 121, 124 or 21, 23, 24, 25, respectively, of the memory cells 122a, 128a or 22a, 26a, 27a, 28a, respectively, may be determined with measuring methods that are known per se and are performed separately (e.g. with corresponding measures performed at the wafer kerf).

From the magnitude of the capacity C of the storage capacitor, and the RC constant of the memory cells 122a, 128a, or 22a, 26a, 27a 28a determined in the above-mentioned manner, the (series) resistance value of the (current) path connected to the storage capacitors 121, 124, or 21, 23, 24, 25, respectively, may be determined, in particular the ohmic resistance of the connection between the memory cell capacitor 121, 124 or 21, 23, 24, 25, respectively, and the respective memory cell access transistor 122, 128 or 22, 26, 27, 28, respectively.

In alternative variants of the inventive measuring method, the ring oscillator 110 may, in the "special test mode", be operated selectively in one of several sub modes in which respectively different and/or a different number of memory cells 122a, 128a, or 22a, 26a, 27a, 28a, respectively (or more exactly: memory cell capacitors 121, 124, or 21, 23, 24, 25, respectively) are selectively connected to the ring oscillator 110, i.e. are connected in an electroconductive manner with the ring oscillator 110.

From the differences between the measured signal frequencies resulting for the ring oscillator 110 in the respective sub modes of the "special test mode" (and/or the differences between the signal frequencies in the respective "special test" sub modes and in the "normal test mode"), the respective time required for charging/discharging the memory cells 122a, 128a, or 22a, 26a, 27a, 28a, respectively, may again—possibly with greater exactness than with the above-described proceeding—be inferred to (and thus the RC constant of the memory cells 122a, 128a or 22a, 26a, 27a, 28a, respectively).

In further alternative variants of the inventive measuring method, the respective access transistor 122, 128 of the respective (test or dummy) memory cell 122a, 128a may, in the above-mentioned "special test mode" (and/or in the above-mentioned "special test" sub modes), be connected through in a differently strong manner, i.e. be placed in respective differently strongly conductive states (in particular e.g. in more than two, four, or six, etc., or any more, e.g. more than ten or twenty differently strongly conductive states), by applying control signals having differently high voltage levels to the corresponding test control line 131, 133 (i.e. by using different access transistor gate voltages).

From the differences between the measured signal frequencies resulting for the ring oscillator 110 with respectively different access transistor gate voltages (or during the "scanning through" with differently strongly conductive states of the respective access transistor 122, 128), the switching behavior of the access transistor 122, 128 may be inferred to (and thus, for instance, the word line voltage level may be set optimally).

In further alternative embodiments, the ring oscillator may, instead on the DRAM, also be arranged separately from the DRAM, e.g. on a separate device or, for instance, on a—separate—test structure arranged on the same wafer as the DRAM.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A measuring method for a semiconductor memory, comprising:
    connecting a storage capacitor of a memory cell to a connecting line between an output of a first inverter and an output of a second inverter of a ring oscillator comprising an odd number of inverters by placing an access transistor coupled between the connecting line and the memory cell in a series of at least two successively stronger conducting slates other than a non-conducting state; and
    measuring the resulting frequency of the ring oscillator for each of the at least two successively stronger conducting states.

2. The measuring method according to claim 1, wherein, for placing the access transistor in the at least two conductive states includes providing a different voltage to a gate of the access transistor for each of the at least two successively stronger conducting states.

3. The measuring method according to claim 1, further comprising:
    comparing the resulting frequencies for said ring oscillator with said memory cell being connected to said ring oscillator at each of the at least two successively stronger conducting states of the access transistor to determine an RC constants of the memory cell.

4. The measuring method according to claim 1 further comprising:
    connecting a further memory cell to said ring oscillator in addition to said memory cell; and
    measuring the frequency resulting for said ring oscillator.

5. The measuring method according to claim 4, further comprising:
    disconnecting said further memory cell from said ring oscillator.

6. The measuring method according to claim 5, further comprising:
    comparing the frequencies resulting for said ring oscillator with said memory cell and said further memory cell being connected to said ring oscillator, and with said memory cell being connected to said ring oscillator and said further memory cell being disconnected from said ring oscillator.

7. The measuring method according to claim 1, wherein said memory cell and/or said further memory cell is/are DRAM memory cell(s).

8. The measuring method according to claim 2, wherein placing the access transistor includes placing the access transistor in more than two, four, or six differently strongly conductive states.

9. An integrated circuit comprising:
    a memory cell including a storage capacitor;
    a ring oscillator comprising a plurality of inverters coupled in series with one another to form a ring; and
    an access transistor for connecting the memory cell to a line connecting an output of a first inverter and an input of a second inverter of the ring oscillator, wherein the access transistor is configured to be placed in a series of at least two successively stronger conducting states other than a non-conducting state,
    a measuring device configured to measure a resulting frequency of the ring oscillator at each of the at least two successively stronger conducting states, and to determine an RC constant of the memory cell based on the measured frequencies.

10. The semiconductor memory according to claim 9, wherein said ring oscillator is adapted to be connected to a pad of the integrated circuit for measuring the frequency resulting for said ring oscillator on connecting said memory cell to said ring oscillator.

11. The semiconductor memory according to any of claim 9, wherein said memory cell is a memory cell used for storing reference data in normal operation of the integrated circuit.

12. The semiconductor memory according to any of claim 9, wherein said memory cell is a dummy memory cell.

13. A semiconductor memory comprising:
    at least one memory cell;
    a ring oscillator comprising a plurality of inverters coupled in series with one another to form a ring; and
    means for connecting a storage capacitor of the at least one memory cell to a line connecting an output of a first inverter and an output of a second inverter of the ring oscillator via a path having a series of at least two successively stronger conducting states other than a non-conducting state; and
    means for measuring a resulting frequency of the ring oscillator for each of the at least two successively stronger conducting states of the path; and
    means for determining an RC constant of the at least one memory cell based on the measured frequencies of the ring oscillator.

14. The semiconductor memory of claim 13, wherein the patch comprises an access transistor coupled between the at least one memory cell and the ring oscillator.

15. The semiconductor memory of claim 14, wherein the ring oscillator is coupled to a pad of the semiconductor and configured to measure a frequency of the ring oscillator.

16. The semiconductor memory of claim 15, wherein the memory cell stores reference data.

* * * * *